(12) United States Patent  
Kuwabara et al.

(10) Patent No.: US 7,374,417 B2
(45) Date of Patent: May 20, 2008

(54) STAMPER AND TRANSFER APPARATUS

(75) Inventors: Kosuke Kuwabara, Hitachi (JP);
Akihiro Miyauchi, Hitachi (JP);
Masahiko Ogino, Hitachi (JP);
Sigehisa Motowaki, Hitachi (JP)

(73) Assignee: Hitachi, Ltd., Tokyo (JP)

( * ) Notice: Subject to any disclaimer, the term of this patent is extended or adjusted under 35 U.S.C. 154(b) by 540 days.

(21) Appl. No.: 10/802,777

(22) Filed: Mar. 18, 2004

(65) Prior Publication Data

US 2004/0191700 A1 Sep. 30, 2004

(30) Foreign Application Priority Data

Mar. 31, 2003 (JP) .............................. 2003-093091

(51) Int. Cl.
*B29C 43/10* (2006.01)
*B32B 3/00* (2006.01)
*G11B 7/26* (2006.01)

(52) U.S. Cl. ...................... 425/385; 425/470; 425/810; 216/44

(58) Field of Classification Search ................ 425/810, 425/470, 403, 385; 216/41, 44, 54
See application file for complete search history.

(56) References Cited

U.S. PATENT DOCUMENTS

| 4,723,903 | A | * | 2/1988 | Okazaki et al. | ............. | 425/385 |
| 4,953,385 | A | * | 9/1990 | Aoki et al. | .................... | 72/462 |
| 5,344,304 | A | * | 9/1994 | Tamura et al. | .............. | 425/195 |
| 5,763,002 | A | * | 6/1998 | Ledieu et al. | ................ | 427/145 |
| 5,817,242 | A | * | 10/1998 | Biebuyck et al. | ............. | 216/41 |
| 6,069,740 | A | * | 5/2000 | Hamanaka | ................... | 359/620 |
| 6,309,580 | B1 | * | 10/2001 | Chou | ......................... | 264/338 |
| 6,385,997 | B1 | * | 5/2002 | Nelson et al. | ................. | 65/64 |
| 6,869,557 | B1 | * | 3/2005 | Wago et al. | ................ | 264/293 |
| 6,957,608 | B1 | * | 10/2005 | Hubert et al. | ............... | 101/483 |
| 2002/0171026 | A1 | * | 11/2002 | Kuroda | .................... | 249/114.1 |
| 2004/0247732 | A1 | * | 12/2004 | Walk | ......................... | 425/385 |
| 2006/0127522 | A1 | * | 6/2006 | Chou | ......................... | 425/150 |

FOREIGN PATENT DOCUMENTS

| JP | 02113456 A | * | 4/1990 |
| JP | 02126434 A | * | 5/1990 |
| JP | 5-73968 | | 3/1993 |
| JP | 5-80530 | | 4/1993 |
| JP | 10-283681 | | 10/1998 |

OTHER PUBLICATIONS

Ruchhoeft et al.; Patterning curved surfaces: Template generation; Nov./Dec. 1999; American Vacuum Society; vol. 17, No. 6; pp. 2965-2969.*

* cited by examiner

*Primary Examiner*—Yogendra N. Gupta
*Assistant Examiner*—Dimple N. Bodawala
(74) *Attorney, Agent, or Firm*—Antonelli, Terry, Stout & Kraus, LLP.

(57) ABSTRACT

A stamper and a transfer apparatus that utilizes the stamper, which is capable of accurately transferring its own pattern onto an article, such as a substrate, without being affected by any distribution of convex portions on the stamper surface or any contour of the substrate. The stamper has a fine concave-convex pattern on a surface thereof for forming a fine structure on a substrate using a pressing machine. The stamper is flexible and includes a buffer formed on an opposite side to the side on which the concave-convex pattern is formed. The buffer has a longitudinal distribution of moduli of elasticity.

12 Claims, 11 Drawing Sheets

900

STAMPER AND TRANSFER APPARATUS

BACKGROUND OF THE INVENTION

1. Technical Field

The present invention relates to a stamper for forming a fine pattern or a structure on a substrate. It also relates to a transfer apparatus using the stamper.

2. Background Art

FIG. 3 schematically illustrates the process of forming a mask pattern on a thin film provided on a substrate by applying an organic resin to the substrate and then molding the organic resin with a stamper. A stamper 104 is moved over a substrate 101 on which a thin film 103 and an organic resin layer 102 have been formed, while pressing evenly the stamper onto the organic resin layer 102 that has not been cured, thereby transferring a pattern formed on the stamper onto the organic resin layer 102. After the transfer of the pattern, the organic resin layer 102 is heated or irradiated with light so as to cure the organic resin layer 102 and thus fix its shape, thereby forming a mask pattern 105 to be used as a protective mask for etching. Using this mask pattern 105, the thin film 103 is etched such that the thin film is removed except where the film is masked by the mask pattern 105, thereby patterning the thin film (see JP Patent Publication (Kokai) No. 5-80530 A (1993) (par. 0023 to 0028 and FIG. 1), for example).

As a method of allowing only the concave-convex pattern on the surface of the stamper to be transferred in spite of irregularities in the thickness of the stamper or bulges on the back surface of the stamper, the following is known. FIG. 4 shows a process of transferring the shape of the stamper to a photosensitive resin 112 by pressing a base plate 111 onto the resin 112. Behind the stamper 113 are disposed a member 117, a two-sided adhesive tape 116, a resilient member 115 and a vinyl sheet 114. Thus, any irregularities in the thickness of the stamper 113 or bulges on the back surface of the stamper can be absorbed by the resilient member 115 disposed behind the stamper (see JP Patent Publication (Kokai) No. 5-73968 A (1993) (par. 0011 and FIG. 1), for example).

Of the aforementioned conventional techniques, the one illustrated in FIG. 3, whereby the pattern is transferred to the resin on the silicon substrate, employs a rigid body made of a light-transmitting organic resin or glass as the stamper. The surface of the stamper or the silicon substrate has height irregularities on the order of several micrometers. These height irregularities pose an obstacle in accurately transferring fine structures on the order of micrometers or less.

This problem can be overcome by producing the stamper with a flexible material such that the stamper can accommodate the contour of the substrate. However, in order to allow such a flexible stamper to follow the contour of the substrate accurately, a buffer must be disposed on the back surface of the stamper. As such a buffer, the resilient member that is used in the other conventional technique, namely the transfer process illustrated in FIG. 4, could be used.

When the flexible stamper is pressed onto the resin on the substrate, the areas on the surface of the stamper that have many convex portions come into contact with the resin first. As a result, these areas receive a larger resistance from the resin than other areas on the stamper surface and are warped, such that the pattern on the stamper surface cannot be correctly transferred to the resin. Such unevenness in the transfer cannot be solved by the use of the resilient member in the transfer process for photosensitive resin as shown in FIG. 4, whereby force is applied to the entire surface of the stamper in an equal manner.

It is therefore the object of the invention to provide a stamper capable of accurately transferring the pattern on the stamper to a transferred item without being influenced by the distribution of the convex portions on the stamper surface or irregularities of the substrate, a transfer apparatus that utilizes such stamper.

SUMMARY OF THE INVENTION

A pattern formed on the surface of a stamper can be accurately transferred without being affected by any distribution of convex portions of the surface of the stamper or any contour of a substrate, by forming, on a back side of the stamper, a buffer with a distribution of moduli of elasticity.

In one aspect, the invention provides a method of using a stamper that is backed with a buffer having a distribution of moduli of elasticity such that a portion of the buffer that corresponds to a portion of the stamper that has more convex portions has a high modulus of elasticity, as shown in FIG. 1. The buffer having such a distribution of moduli of elasticity can apply a force to the stamper that is commensurate with the distribution of resistance the stamper experiences from an organic resin layer due to the distribution of convex portions of the stamper surface, as the stamper is pressed onto the organic resin layer that has been softened. Thus, the stamper pattern can be accurately transferred onto the softened organic resin layer.

In another aspect, the invention provides a method of using a stamper that is backed with a buffer. A portion of the buffer that corresponds to a portion of the surface of the stamper that has more convex portions is formed to be thin, as shown in FIG. 2. This technique also makes it possible to apply a force to the stamper that is commensurate with the distribution of resistance the stamper experiences from an organic resin layer due to the distribution of convex portions of the stamper surface, as the stamper is pressed onto the organic resin layer that has been softened. Thus, the stamper pattern can be accurately transferred onto the softened organic resin layer.

DETAILED DESCRIPTION OF THE PREFERRED EMBODIMENTS

Example 1

Figure 5:
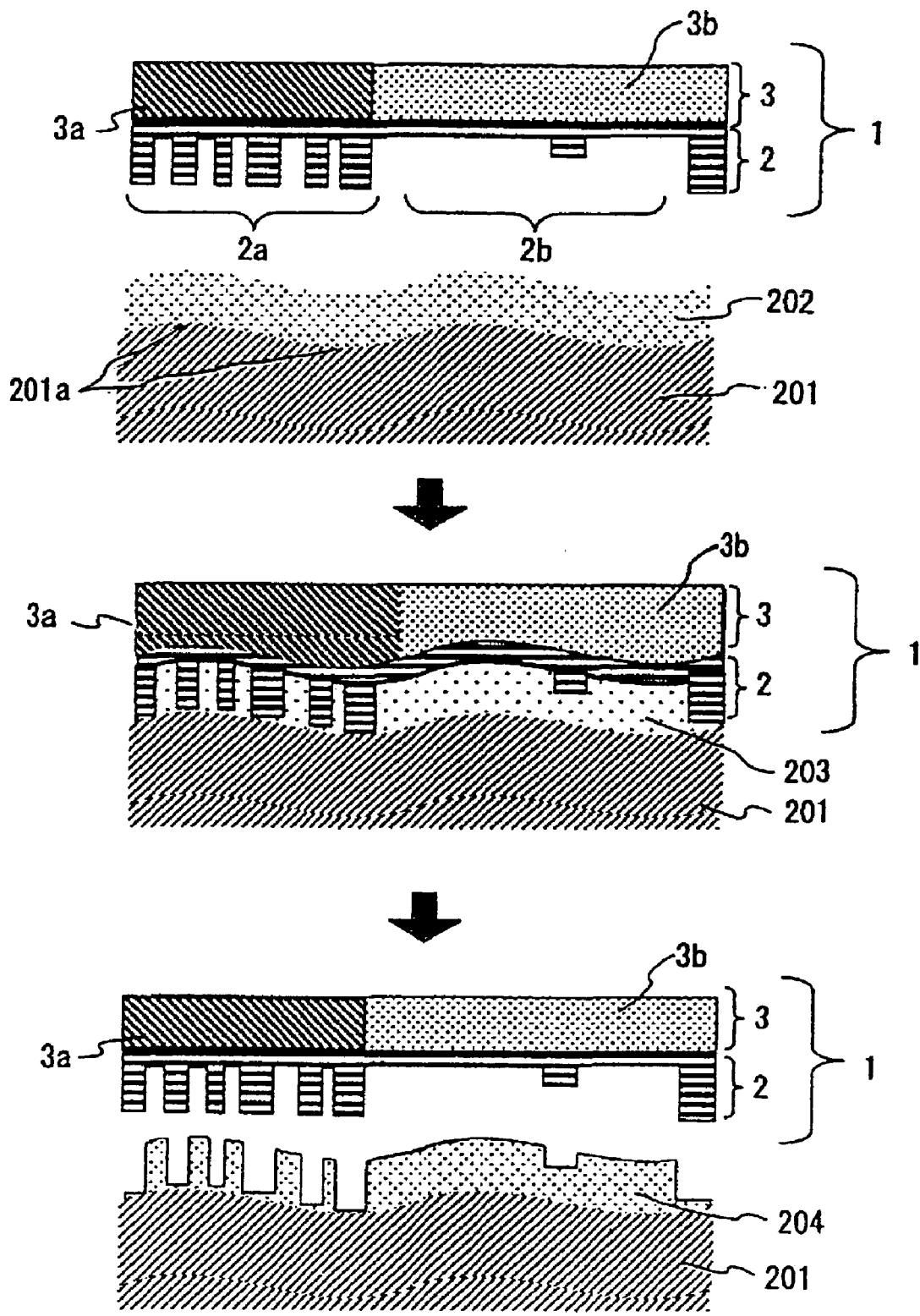
FIG. 5 shows a transfer method according to Example 1.

An embodiment of the invention will be hereafter described. FIG. 5 shows an example of a transfer process in one aspect of the invention.

First, an organic resin layer 202 of PMMA (poly(methylmethacrylate)) was formed on a silicon wafer substrate 201 with a crystal orientation (100) and a diameter of 150 mm, using a spin coat method. The organic resin layer 202 had a thickness of 1 μm and a melting point of approximately 220° C.

Figure 1:
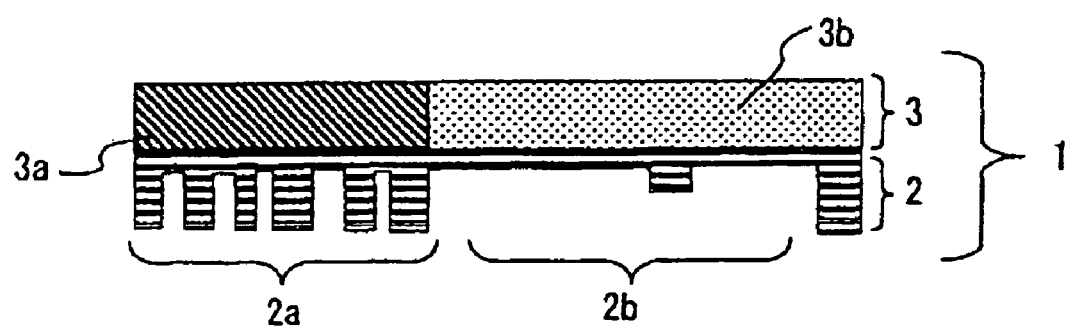
FIG. 1 shows the structure of a stamper provided by the invention.

FIG. 1 shows a stamper 1 used in the present embodiment. The stamper 1 comprised a flexible stamper layer 2 of a nickel-electroformed film and a buffer 3. The buffer 3 was patterned by a screen printing method such that the modulus of elasticity had a longitudinal distribution. Specifically, the buffer 3 is patterned with portions with a high and a low modulus of elasticity in accordance with the density of convex portions of the flexible stamper layer 2, such that a portion 3a with a high modulus of elasticity corresponds to a portion 2a of the stamper layer surface that has many convex portions, and a portion 3b with a low modulus of elasticity corresponds to a portion 2b of the stamper layer surface that has few convex portions.

The stamper 1 was pressed onto the substrate 201 at a temperature exceeding the melting point of the organic resin layer 202, as shown in FIG. 5. The portion 2a of the flexible stamper layer 2, which has many convex portions, receives a large resistance from the organic resin layer 203 that has been softened. Simultaneously, the portion 2a of the flexible stamper layer 2 receives a force from the portion 3a of the buffer 3, which has a high modulus of elasticity, the force being commensurate with the aforementioned resistance. As a result, the flexible stamper layer 2 and the buffer 3 can be deformed in conformity with a contour 201a of the substrate. Thus, in the present embodiment, the buffer 3 with different longitudinal moduli of elasticity was disposed on the back surface of the flexible stamper layer 2, so that the pattern on the stamper 1 was accurately transferred to the softened organic resin layer.

While in the embodiment a silicon wafer with crystal orientation (100) and a diameter of 150 mm is used as the substrate 201, the substrate 201 may be formed by other materials, such as inorganic materials including glass, and organic materials including polycarbonate. The substrate 201 may also be constructed of a layered structure made of the aforementioned materials.

Further, while in the present embodiment the organic resin layer 202 made of PMMA is formed on the surface of the substrate 201, the organic resin layer 202 may be made of materials other than PMMA. For example, the organic resin layer 202 may contain, as a principal component, an organic material such as cycloolefin polymer, polystyrene, polycarbonate or polypropylene, or an inorganic material such as silica.

While in the present embodiment the flexible stamper layer 2 comprises a nickel-electroformed film, the layer does not necessarily need to be an electroformed film, nor the material necessarily need to be nickel. For example, the flexible stamper layer 2 may be formed by sputtering, vacuum-vapor deposition or chemical vapor deposition (CVD), or by performing etching or some mechanical process, such as cutting, on a bulk material. The material may be, for example, iron or copper in the form of a metal thin film, or a flexible organic material such as poly (dimethylsiloxane) (PDMS). Further preferably, a stamper structure may be directly formed on a buffer layer, which will be described later. A backing film made of a metal thin film of an organic material such as polyimide, or iron or copper may be inserted on the back surface of the flexible stamper layer, so that the flexible stamper layer can be increased in strength and its handling can be facilitated. An organic/inorganic mold-releasing layer made of silicone, fluororesin, diamond-like carbon and/or other materials may be formed on the surface of the flexible stamper layer 2. In this way, a softened organic resin layer 203 can be prevented from attaching to the flexible stamper layer 2, so that the transfer accuracy and the stamper lifetime can be increased.

In the present embodiment, the buffer 3 comprises silicone buffer materials KJR9051 with a high modulus of elasticity (Shin-Etsu Silicones, with a JIS-A hardness of 41) and KJR9060 with a low modulus of elasticity (Shin-Etsu Silicones, with a JIS-A hardness of 15). However, these are merely examples and the buffer 3 may be made of other elastic substances in which differences in modulus of elasticity can be manifested, such as fluororesin. For the patterning of the buffer with different moduli of elasticity, a stencil printing method, an inkjet method or other method may be used, in addition to the screen printing method that is employed in the present embodiment. When a substance that produces photo-polymerization reaction, such as photoreactive resin, is employed as an elastic material, the elastic material may be patterned with different moduli of elasticity by producing a partial photo-polymerization reaction. A distribution of moduli of elasticity may also be achieved by using a foamed resin, foamed metal or springs, in which a distribution of moduli of elasticity can be obtained based on a density distribution. Further, while in the present embodiment the buffer 3 is provided with a distribution of moduli of elasticity in advance, it should be obvious that, in cases where the flexible stamper layer 2 has a light-transmitting property, the buffer 3 may be provided with an elasticity modulus distribution after the buffer 3 has been set on the back surface of the flexible stamper layer 2 for a photo-polymerization reaction that utilizes the flexible stamper layer 2 as a mask.

While in the present example the transfer temperature was set to be the melting point of the organic resin layer 202 or higher, it should be obvious that there is no need to set the transfer temperature to be the melting point of the organic resin layer 202 or higher if the organic resin layer 202 is softened sufficiently that it can be deformed.

Example 2

Figure 6:
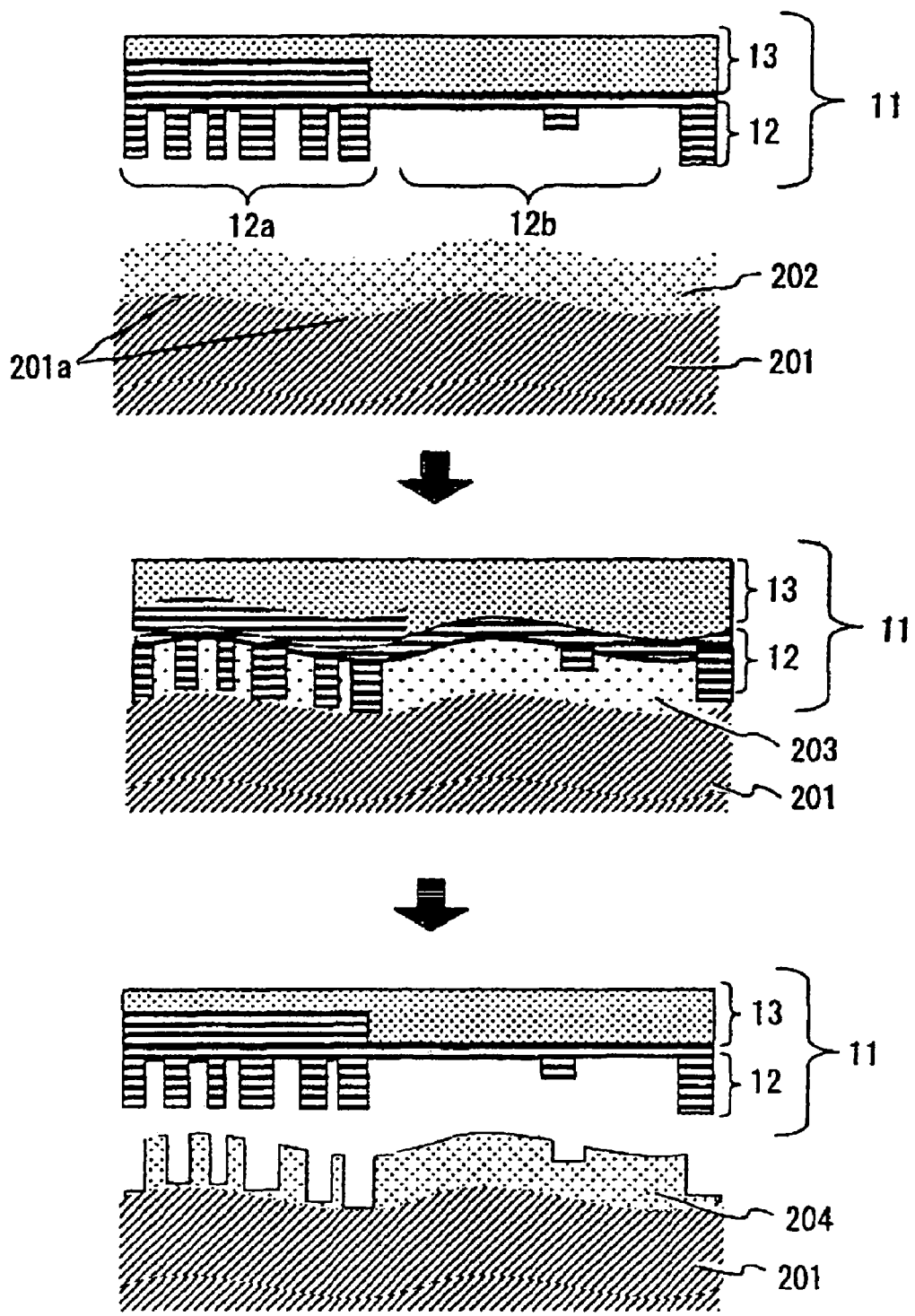
FIG. 6 shows a transfer method according to Example 2.

Another example of the invention will be described. FIG. 6 shows an example of a transfer process according to another aspect of the invention.

An organic resin layer 202 of PMMA with a crystal orientation (100) was formed on a silicon wafer substrate 201 with a diameter of 150 mm by a spin coat method. The organic resin layer 202 had a thickness of 1 μm and a melting point of about 220° C.

Figure 2:
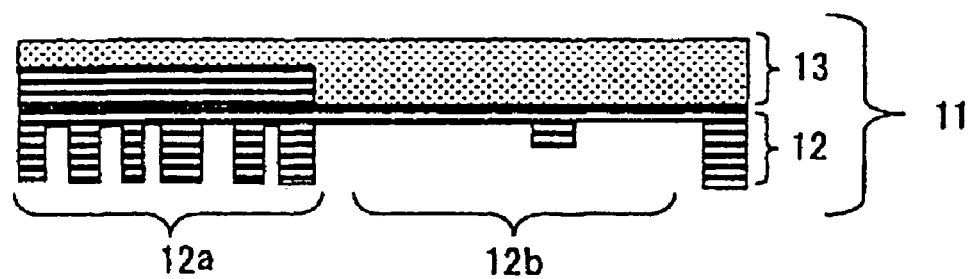
FIG. 2 shows another structure of the stamper provided by the invention.
Figure 3:
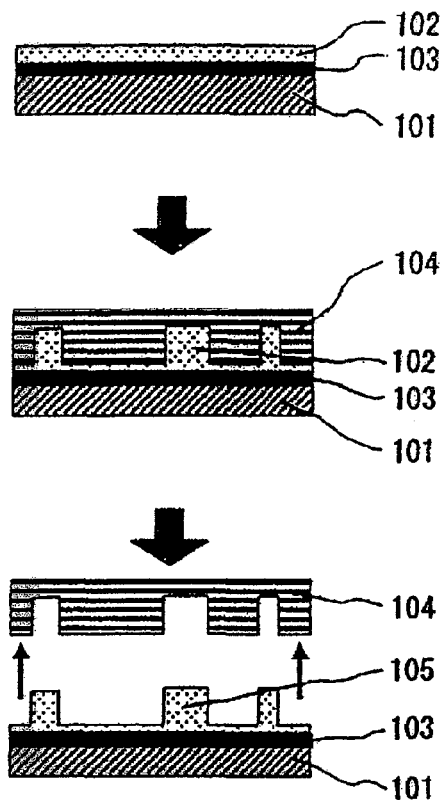
FIG. 3 shows a process of transferring a pattern on a stamper onto a resin applied to a silicon substrate by pressing the stamper onto the resin, according to the prior art.
Figure 4:
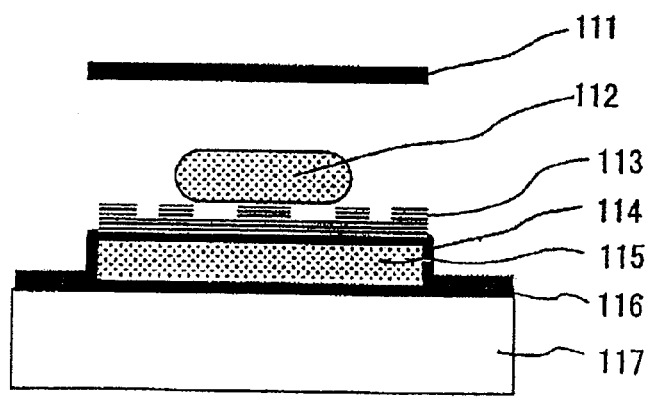
FIG. 4 shows a technique of transferring the stamper pattern in an even manner despite any irregularities in the thickness of the stamper or any convex portion on a back surface of the stamper, according to the prior art.

FIG. 2 shows a stamper 11 used in the present example. The stamper 11 comprised a flexible stamper layer 12 made of a nickel-electroformed film, and a buffer 13. The buffer 13 was patterned with various thicknesses in accordance with the density of the convex portions of the surface of the flexible stamper layer 2. Specifically, a portion of the stamper that corresponds to a portion 12a of the surface of the flexible stamper layer 12 that had more convex portions was formed to be thin, while a portion of the stamper that corresponds to a portion 12b of the surface of the flexible stamper layer 12 that had fewer convex portions was formed to be thick.

The stamper 11 was pressed onto the substrate 201 at a temperature exceeding the melting point of the organic resin layer 202, as represented by the softened organic resin layer 203 shown in FIG. 5 and FIG. 6. As a result, the flexible stamper layer 12 and the buffer 13 were deformed in conformity with a contour 201a of the substrate. The portion 12a of the flexible stamper layer 12 that has more convex portions receives a larger resistance from the organic resin layer 203 that has been softened. The portion 12a with more convex portions, however, receives a force from the thin portion of the buffer 13 that is commensurate with the resistance. Thus, the pattern of the stamper was accurately transferred to the organic resin layer represented by the organic resin layer 204, as shown in FIG. 5 and FIG. 6.

While in the present example the substrate 201 comprised a silicon wafer with crystal orientation (100) and a diameter of 150 mm, the substrate 201 may be made of other materials, such as an inorganic substance including glass, or an organic substance including polycarbonate. The substrate 201 may also be made of a layered structure of the aforementioned materials.

While in the present example the organic resin layer 202 of PMMA was formed on the surface of the substrate 201, this is only an example and the organic resin layer 202 may contain, as a principal component, an organic material such as cycloolefin polymer, polystyrene, polycarbonate, or polypropylene, or an inorganic material such as silica.

While in the present example the flexible stamper layer 12 comprised a nickel-electroformed film, the layer does not necessarily need to be an electroformed film, nor the material necessarily need to be nickel. For example, the flexible stamper layer 12 may be formed by sputtering, vacuum-vapor deposition or CVD, or by performing etching or some mechanical process, such as cutting, on a bulk material. The material may be, for example, iron or copper in the form of a metal thin film, or a flexible organic material such as PDMS. Further preferably, a stamper structure may be directly formed on a buffer layer, which will be described later. A backing film made of a metal thin film of an organic material such as polyimide, or iron or copper may be inserted on the back surface of the flexible stamper layer 12, so that the flexible stamper layer can be increased in strength and its handling can be facilitated. An organic/inorganic mold-releasing layer made of silicone, fluororesin, diamond-like carbon and/or other materials may be formed on the surface of the flexible stamper layer 12. In this way, a softened organic resin layer 203 can be prevented from attaching to the flexible stamper layer 12, so that the transfer accuracy and the stamper lifetime can be increased.

In the present embodiment, the buffer 3 comprised a KJR9051 silicone buffer material (Shin-Etsu Silicones, with a JIS-A hardness of 41). However, this is only an example and the buffer 3 may be made of other materials such as an elastic resin including fluororesin, or a non-resin elastic material such as foam metal. For the pattering of the buffer with different thicknesses, various methods may be used, such as a stencil printing method, an inkjet method, or by a mechanical machining involving a partial cutting or grinding, in addition to the screen printing method used in the example. Further, a distribution of thicknesses may be formed by taking advantage of variations in the thickness of the flexible stamper layer 12 itself.

While in the present example the transfer temperature was set to be the melting point of the organic resin layer 202 or higher, it should be obvious that there is no need to set the transfer temperature to be the melting point of the organic resin layer 202 or higher if the organic resin layer 202 is softened sufficiently that it can be deformed.

Examples of the Application of the Invention

Hereafter, several fields to which the nanoprinting technique using the stamper with a release-mechanism according to the invention can be suitably applied will be described.

Example 3

Biochip

Figure 7:
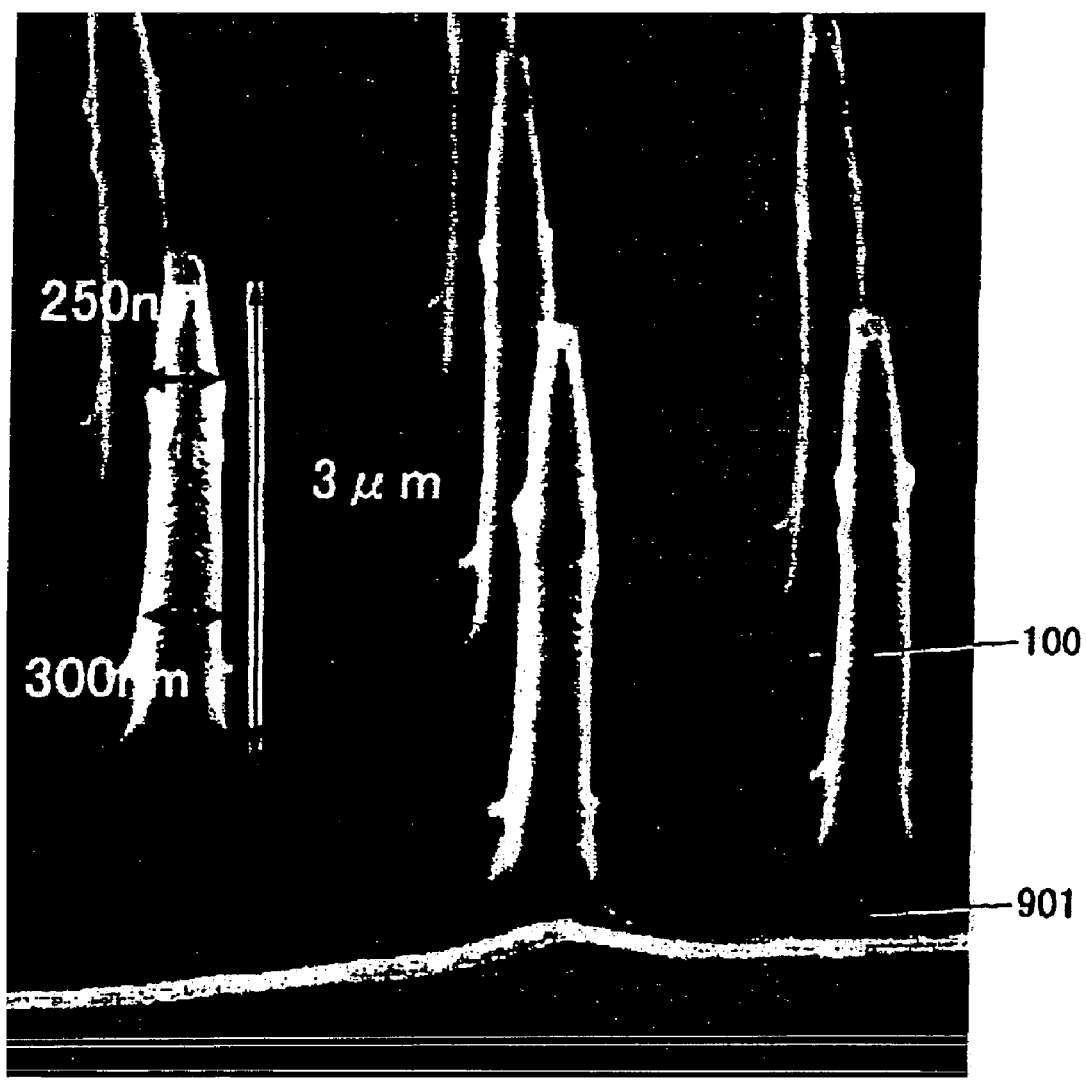
FIG. 7 shows an enlarged scanning electron micrograph of a projection assembly.
Figure 8:
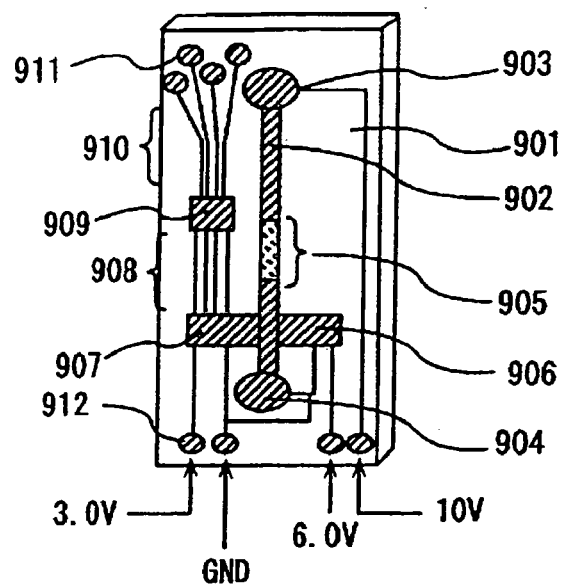
FIG. 8 shows a biochip according to Example 3.

FIG. 8 schematically shows a biochip 900. In a substrate 901 made of glass is formed a passage 902 with a depth of 3 μm and a width of 20 μm. A specimen containing DNA (deoxyribonucleic acid), blood, protein, or the like is introduced via an inlet 903 and is caused to flow in the passage 902 until it reaches an outlet 904. A molecular filter 905 is disposed in the passage 902. In the molecular filter 905, there is formed a projection assembly 100 measuring 250 to 300 nm in diameter and 3 μm in height. FIG. 7 shows an enlarged view of the projection assembly 100.

Figure 9:
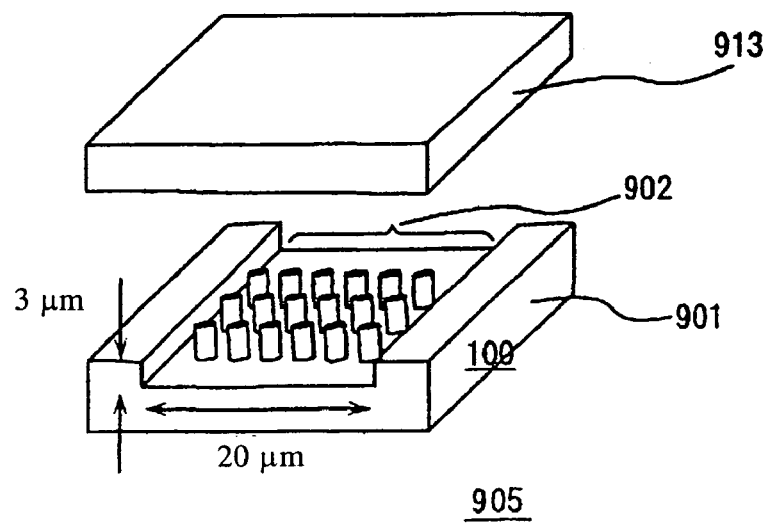
FIG. 9 shows a perspective view of the biochip near where a molecular filter is formed.

FIG. 9 is a perspective view of the biochip 900 near where the molecular filter 905 is formed. The projection assembly 100 is formed in a part of the passage 902 formed on the substrate 901. The substrate 901 is covered with an upper substrate 913 so that the specimen flows inside the passage 902. In the case of a DNA chain-length analysis, while a specimen containing DNA is electrophoresed in the passage 902, DNA is separated by the molecular filter 905 depending on the chain length of the DNA with high resolution. The specimen that has passed through the molecular filter 905 is irradiated with a laser light emitted by a semiconductor laser 906 mounted on the surface of the substrate 901. When the DNA passes, the light incident on a photodetector 907 is reduced by about 4%, so that the chain length of DNA in the specimen can be analyzed based on an output signal from the photodetector 907. The signal detected in the photodetector 907 is fed to a signal processing chip 909 via a signal line 908. To the signal processing chip 909 is connected another signal line 910, which is also connected to an output pad 911 for connection with an external terminal. Power is supplied to individual components via a power supply pad 912 provided on the surface of the substrate 901.

Figure 10:
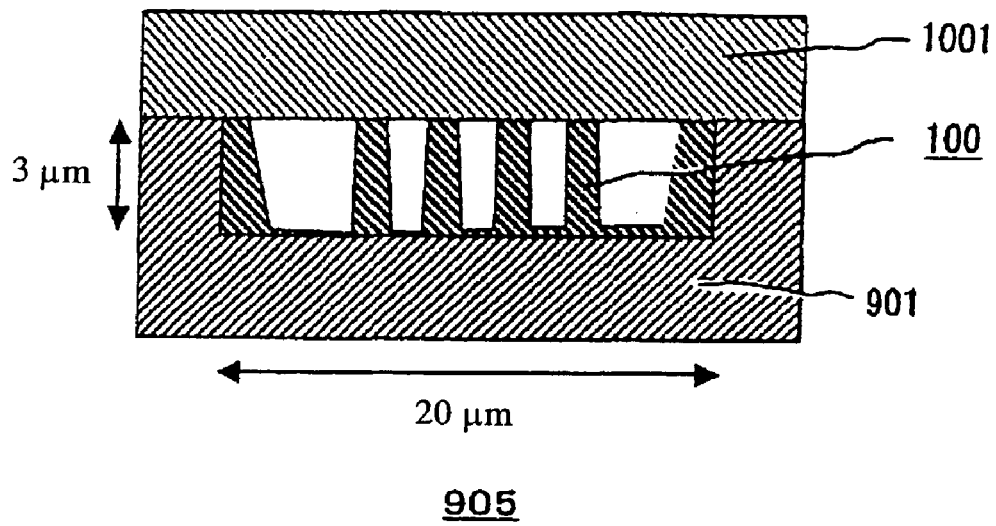
FIG. 10 shows a cross section of the molecular filter.

FIGS. 9 and 10 show a cross section of the molecular filter 905 which, according to the present embodiment, comprises a substrate 901 with a concave portion, a plurality of projections formed on the concave portion of the substrate 901, and an upper substrate 913 formed to cover the concave portion. The projections are formed such that their tips are in contact with the upper substrate. The projection assembly 100 is mainly made of an organic material and can therefore be deformed. Thus, the projection assembly 100 is not subject to damage when the upper substrate 913 is mounted over the passage 902. The upper substrate 913, therefore, can be placed in contact with the projection assembly 100. In this arrangement, highly sensitive analysis can be performed without the specimen being leaked from the gap between the projections and the upper substrate 913. When a chain-length analysis of DNA was actually conducted, it was learned that while the half-value width of resolution of the base pairs was 10 base pairs in the case of a projection assembly made of glass, it was possible to improve the half-value width of resolution of the base pairs to 3 base pairs in the case of a projection assembly 100 made of an organic material. While the molecular filter in the present embodiment has a structure such that the projections are in contact with the upper substrate, a film made of the same material as that of the projections may be formed on the upper substrate such that the projections are in contact with the film. In this way, better contact can be obtained.

While in the present embodiment there is only one passage 902, a plurality of passages 902 in which projections of different sizes are disposed may be provided. In this way, different kinds of analysis can be performed simultaneously.

Figure 11:
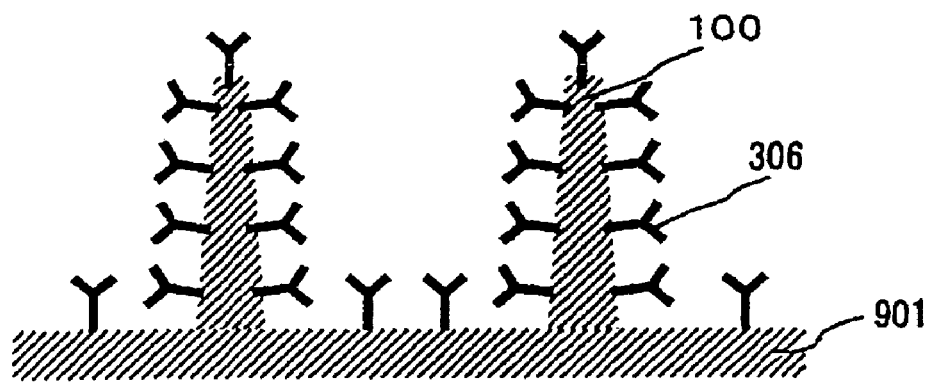
FIG. 11 shows an enlarged view of the projection assembly.

While in the present embodiment DNA was examined as a specimen, a particular sugar chain, protein or antigen may be analyzed by modifying the surface of the projection assembly 100 in advance with a molecule that reacts with the sugar chain, protein or antigen. By thus modifying the surface of the projections with an antibody, improvements can be made in the sensitivity of immunoassay. For example, it is possible to attach various kinds of DNA fragment, or protein 306 to the projection assembly, as shown in FIG. 11.

By applying the invention to a biochip, a projection for the analysis of organic materials with nanoscale diameters can be simply formed. Further, by controlling the shapes of the concave and convex portions on the stamper surface or the viscosity of the organic material thin film, the position, diameter and/or height of the projection made of organic material can be controlled. Thus, in accordance with the invention, there can be provided a microchip for high-sensitivity analysis.

Example 4

Multilayer wiring board

Figure 12:
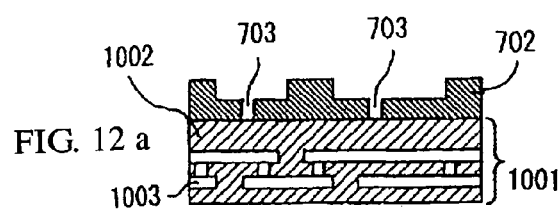
FIG. 12 shows the steps of a process of preparing a multilayer wiring board.
Figure 12:
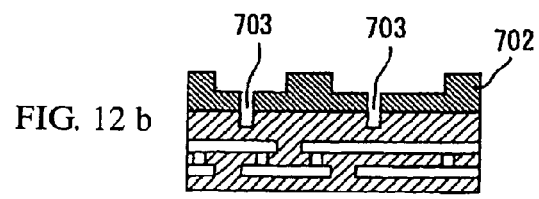
Figure 12:
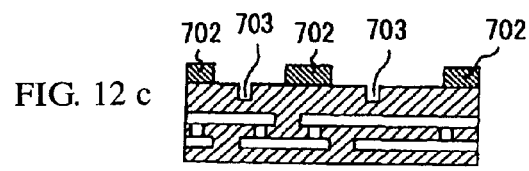
Figure 12:
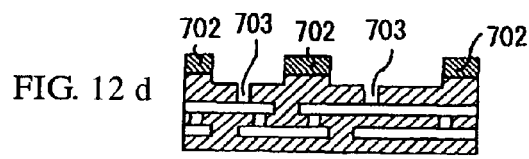
Figure 12:
Figure 12:
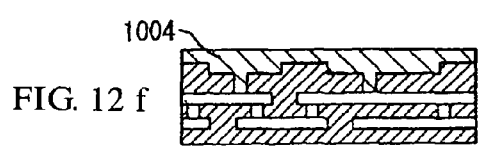
Figure 12:
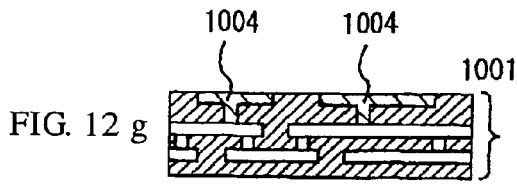
Figure 12:
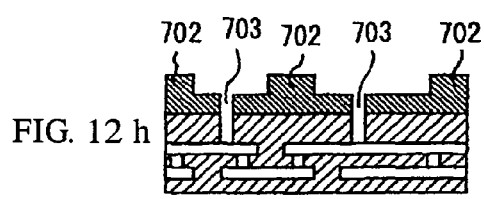
Figure 12:
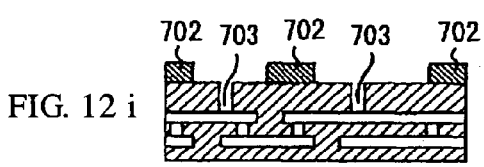
Figure 12:
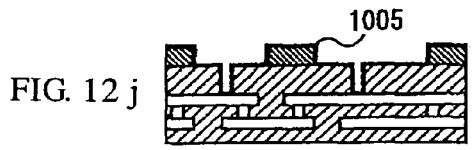
Figure 12:
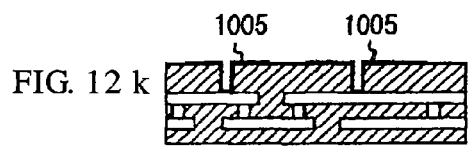
Figure 12:
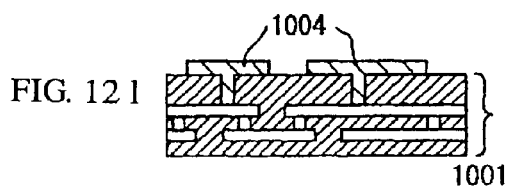

FIG. 12 shows the process of making a multilayered wiring board. After a resist 702 is formed on the surface of a multilayer wiring board 1001 comprising a silicon oxide film 1002 and copper wiring 1003, as shown in FIG. 12(a), a pattern transfer process is carried out using a stamper (not shown). Exposed regions 703 on the multilayer wiring board 1001 are then dry-etched using $CF_4/H_2$ gas. As a result, the exposed regions 703 on the surface of the multilayer wiring board 1001 are processed in the shape of grooves, as shown in FIG. 12(b). The resist 702 is then resist-etched by RIE to thereby remove the resist at the lower-step portions, so that the exposed regions 703 are enlarged, as shown in FIG. 12(c). Thereafter, the exposed regions 703 are dry-etched until the previously formed grooves reach the copper wiring 1003, thereby obtaining a structure as shown in FIG. 12(d). The resist 702 is then removed to obtain the multilayer wiring board 1001 having a grooved surface, as shown in FIG. 12(e). On the surface of the multilayer wiring board 1001 is then formed a metal film by sputtering (not shown), followed by electroplating, thereby forming a metal-plated film 1004 as shown in FIG. 12(f). The metal-plated film 1004 is then polished until the silicon oxide film 1002 on the multilayer wiring board 1001 is exposed, thus obtaining the multilayer wiring board 1001 with metal wiring formed on the surface thereof, as shown in FIG. 12(g).

Another process for making a multilayer wiring board will be hereafter described. Upon dry-etching of the exposed regions 703 in the state shown in FIG. 12(a), by etching until the copper wiring 1003 inside the multilayer wiring board 1001 is reached, the structure shown in FIG. 12(h) is obtained. The resist 702 is then etched by RIE to remove the resist on the lower-step portions, thereby obtaining the structure shown in FIG. 12(i). Thereafter, a metal film 1005 is formed on the surface of the multilayer wiring board 1001 by sputtering, so that the structure shown in FIG. 12(j) is obtained. The resist 702 is then lifted and removed, thereby obtaining the structure shown in FIG. 12(k). By conducting electroplating using the remaining metal film 1005, the multilayer wiring board 1001 can be obtained with the structure shown in FIG. 12(l).

By applying the invention to a multilayer wiring board, wires can be formed with high dimensional accuracy.

Example 5

Magnetic disc

Figure 13:
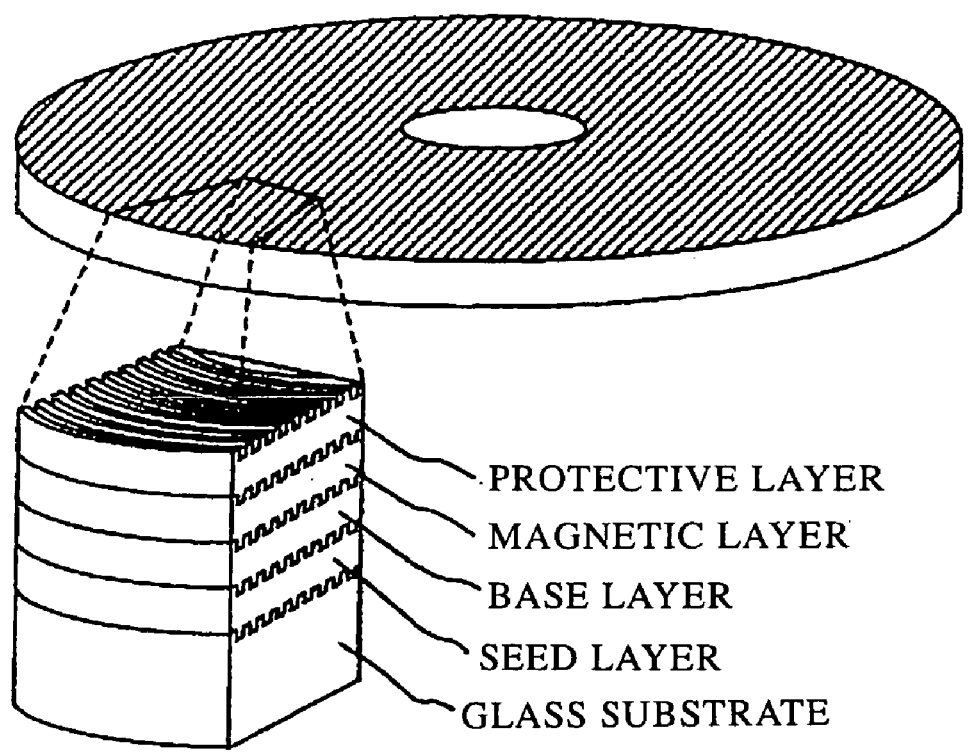
FIG. 13 shows an overall view of a magnetic recording medium, with a portion thereof being enlarged and shown in cross section.
Figure 14:
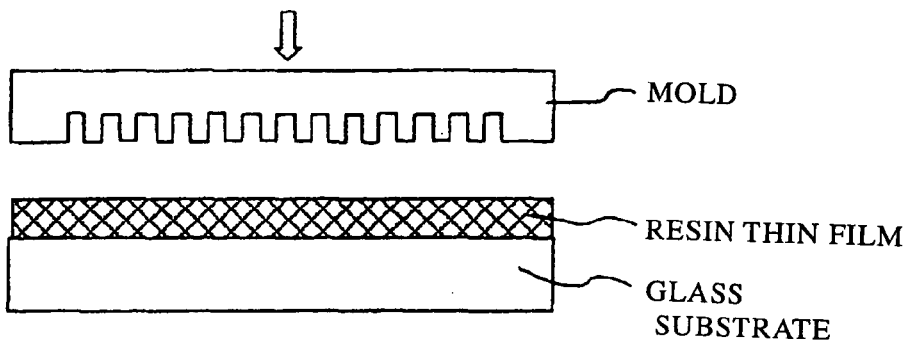
FIG. 14 shows a cross section of a glass material taken along the radius thereof, illustrating a method of forming a concave-convex pattern on the glass material by a nanoprint method.
Figure 14:
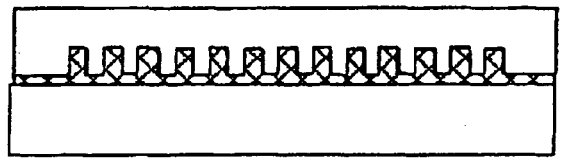
Figure 14:
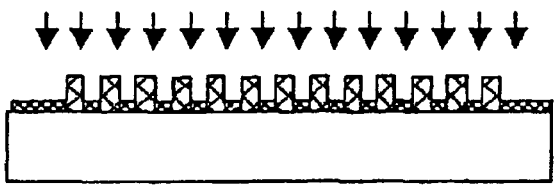
Figure 14:
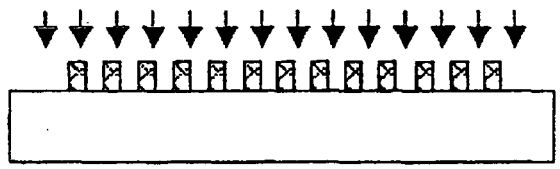
Figure 14:
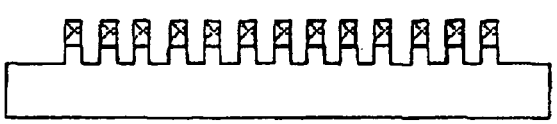
Figure 14:

FIG. 13 shows an overall view of a magnetic recording medium according to this example, with a portion enlarged and shown in cross section. The substrate is made of glass having fine concave and convex portions. On the substrate are formed a seed layer, a base layer, a magnetic layer, and a protective layer. Now referring to FIG. 14, the method of manufacturing a magnetic recording medium according to the present example will be described. FIG. 14 shows a radial cross section of the substrate, illustrating a method of forming concave and convex portions on the glass by a nanoprinting method. First, a glass substrate is prepared. A soda lime glass was used in the present example. The material of the substrate is not particularly limited, with the only requirement being that it can be formed as sheets. Examples include other glass materials such as aluminosilicate glass, and metal materials such as Al. Then, a resin film was formed to a thickness of 200 nm using a spin coater, as shown in FIG. 14(a). The resin was PMMA (polymethyl methacrylate).

For the stamper, a Si wafer was prepared in which grooves were formed concentrically with the opening at the center of the magnetic recording medium. The grooves measured 88 nm in width and 200 nm in depth, and the pitch between the grooves was 110 nm. The convex and concave portions of the stamper, which were very fine, were formed by photolithography using an electron beam. After heating the stamper to 250° C. to reduce the viscosity of the resin, as shown in FIG. 14(b), the stamper was pressed. When the stamper was released at temperature below the glass-transition point of glass, a reversed concave-convex pattern to the pattern on the stamper was obtained, as shown in FIG. 14(c). Thus, using the nanoprinting method, a pattern can be formed that is finer than visible light wavelength and beyond the dimensional limit of exposure by the conventional photolithography. Further, by removing the remaining film at the bottom of the resin pattern by dry etching, a pattern as shown in FIG. 14(d) can be formed. By further etching the substrate with hydrofluoric acid using this resin film as a mask, the substrate can be processed as shown in FIG. 14(e).

By removing the resin with a remover, grooves with a width of 110 nm and a depth of 150 nm were formed, as shown in FIG. 14(f). Thereafter, a seed layer made of NiP was formed on the glass substrate by electroless plating. In the conventional magnetic discs, the NiP layer is formed to a thickness of 10 μm or more. In the present embodiment, the thickness of the NiP layer was limited to 100 nm in order to reflect the fine concave and convex shapes formed on the glass substrate onto the upper layer. Further, a Cr base layer of 15 nm, a CoCrPt magnetic layer of 14 nm, and a C protective layer of 10 nm were successively formed by a sputtering method generally employed in forming magnetic recording media, thereby preparing the magnetic recording medium according to the present embodiment. In this magnetic recording medium, the magnetic substance was radially isolated by the non-magnetic layer wall of with a width of 88 nm. Thus, a higher longitudinal magnetic anisotropy was obtained. While the formation of concentric patterns using a polishing tape (texturing) is known in the art, it can only offer a pattern pitch on the order of microns and is therefore not suitable for high-density recording media. In the magnetic recording medium of the present embodiment, on the other hand, the magnetic anisotropy was ensured by forming the fine pattern by the nanoprinting method, and a high-density recording of 400 GB per square inch was achieved. The nanoprinting pattern formation technique is not limited to the circumferential direction, but it can also be used for forming non-magnetic isolating wall radially. Further, the effect of the present embodiment whereby the magnetic anisotropy is provided is not particularly limited by the materials used in the seed layer, base layer, magnetic layer or protective layer.

Example 6

Optical waveguide

Another example will be described in which an optical device with varying directions of propagation of incident light is applied to an optical information processing apparatus.

Figure 15:
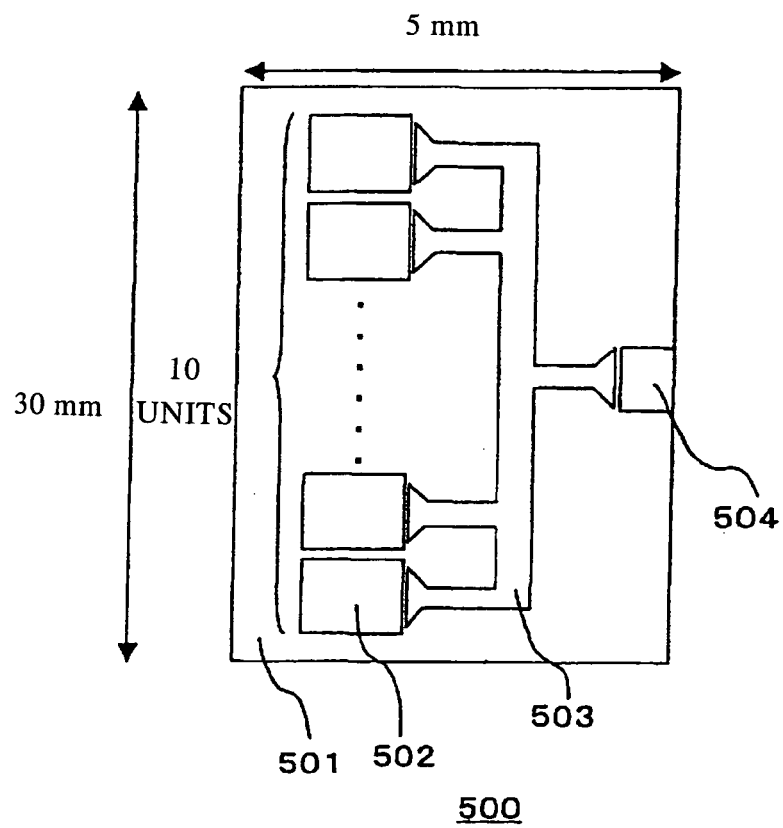
FIG. 15 schematically shows an optical circuit.

FIG. 15 schematically shows the structure of an optical circuit 500 that was prepared. The optical circuit 500 comprised a substrate 501 of aluminum nitride, measuring 30 mm in length, 5 mm in width and 1 mm in thickness. On the substrate 501 were formed ten transmission units 502 each consisting of an InP semiconductor laser and a driver circuit, an optical waveguide 503 and an optical connector 504. The ten semiconductor lasers have different transmission wavelengths varying at 50 nm intervals. The optical circuit 500 is a basic component in optical multiplex communication system devices.

Figure 16:
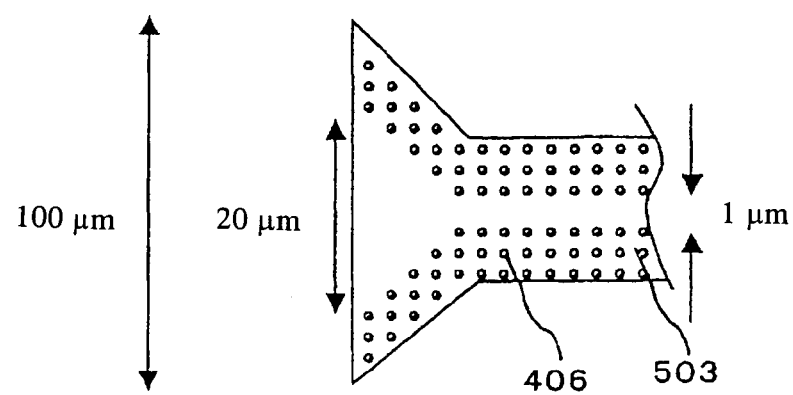
FIG. 16 shows a layout of projections in an optical waveguide.

FIG. 16 schematically shows the layout of projections 406 inside the optical waveguide 503. In order to allow for an alignment error between the transmission unit 502 and the optical waveguide 503, the optical waveguide 503 was formed to be wider toward the end that had a width of 20 μm. Thus, the waveguide had a structure such that a signal light was guided into a region with a width of 1 μm by a photonic bandgap. While the projections 406 were arranged at 0.5 μm intervals in the actual device, the projections 406 in FIG. 16 are shown in a simplified manner and less of them are shown than actually existed.

In the optical circuit 500, the directions of propagation of light can be varied when ten different wavelengths of signal light are superposed and outputted, so that the width of the circuit can be greatly reduced, to 5 mm in the example. Thus, the size of the optical communication device can be reduced.

The projections 406 can be formed by the pressing of a stamper, manufacturing cost can be reduced. While the present example related to a device in which input light is superposed, it should be obvious that the optical waveguide 503 can be usefully applied to all optical devices for controlling an optical path.

By applying the present invention to optical waveguides, the direction of propagation of light can be varied by causing a signal light to propagate in a structure where projections made of an organic material as a principal component are periodically arranged. The projections can be formed by a simple manufacturing technique involving the pressing of a stamper, such that an optical device can be manufactured at low cost.

In accordance with the invention, a stamper, an apparatus and a process can be provided whereby the entire surface of the stamper, even when it has a curved surface, can be evenly provided with the effect of transferring a fine pattern to a substrate with a large area, without being affected by any distortions of micrometer order on the substrate, or the distribution of resistance forces applied to an organic resin layer due to the distribution of convex portions on the stamper surface. By using this stamper, a highly sensitive biochip for analysis purposes can be provided.

What is claimed is:

1. A stamper comprising a stamper layer on a surface of which a fine concave-convex pattern is formed, and a buffer disposed on a side of said stamper layer on which no concave-convex patterned is formed, wherein said buffer has a first portion overlying a first part of the concave-convex pattern, and a second portion overlying a second part of the concave-convex pattern, wherein the first portion and the second portion have different moduli of elasticity.

2. A stamper comprising a fine concave-convex pattern formed on the surface thereof for forming a fine structure on a substrate using a pressing machine, wherein said stamper is flexible, and wherein a buffer is formed on a back side of said stamper overlying the pattern opposite to the side thereof on which the concave-convex pattern is formed, said buffer extending in a plane and having different moduli of elasticity at different portions of the plane.

3. The stamper according to claim 2, wherein said buffer is made of different materials with two or more moduli of elasticity.

4. The stamper according to claim 3, wherein the buffer with two or more moduli of elasticity is disposed on the back surface of said stamper by a screen printing method, a stencil printing method, or an inkjet printing method.

5. The stamper according to claim 3, wherein the buffer with two or more moduli of elasticity is formed on the back side of said stamper by irradiation of light.

6. The stamper according to claim 2, wherein a modulus of elasticity of a first portion of said buffer that corresponds to a first part of said concave-convex pattern is higher than a modulus of elasticity of a second portion of said buffer that corresponds to a second part of said concave-convex pattern, and wherein said first portion has more concave-convex portions than said second portion.

7. A transfer apparatus that utilizes the stamper according to claim 1.

8. A stamper comprising a fine concave-convex pattern formed on a surface thereof for forming a fine structure on a substrate using a pressing machine, wherein said stamper is flexible, and wherein a buffer having different portions with different thicknesses is formed on a back side of said stamper opposite to the side thereof on which the concave-convex pattern is formed.

9. The stamper according to claim 8, wherein the buffer having a longitudinal distribution of thicknesses is disposed by a screen printing method, a stencil printing method or an inkjet printing method.

10. The stamper according to claim 8, wherein the thickness of a first portion of said buffer that corresponds to a portion of said concave-convex pattern is thinner than a second portion of said buffer that corresponds to a portion of the concave-convex pattern, and wherein said first portion has more concave-convex portions than said second portion.

11. A transfer apparatus that utilizes a the stamper according to claim 8.

12. The stamper according to claim 2, wherein the buffer comprises a first portion overlying a first part of the concave-convex pattern, and a second portion overlying a second part of the concave-convex pattern, wherein the first portion and the second portion have different moduli of elasticity.

* * * * *